United States Patent
LaFontaine et al.

(10) Patent No.: US 7,504,198 B2
(45) Date of Patent: Mar. 17, 2009

(54) METHODS FOR ENHANCING RESOLUTION OF A CHEMICALLY AMPLIFIED PHOTORESIST

(75) Inventors: Bruno LaFontaine, Pleasanton, CA (US); Adam R. Pawloski, San Jose, CA (US); Thomas Wallow, San Carlos, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 260 days.

(21) Appl. No.: 11/439,847

(22) Filed: May 24, 2006

(65) Prior Publication Data

US 2007/0275321 A1 Nov. 29, 2007

(51) Int. Cl.
*G03F 7/00* (2006.01)
*G03F 7/004* (2006.01)

(52) U.S. Cl. .................. 430/311; 430/330; 430/270.1; 430/281.1; 430/313; 430/944; 430/945

(58) Field of Classification Search .................. 430/311, 430/330, 945, 944, 270.1, 281.1, 313
See application file for complete search history.

(56) References Cited

U.S. PATENT DOCUMENTS

| | | | |
|---|---|---|---|
| 5,998,099 A | 12/1999 | Houlihan et al. | |
| 6,093,508 A * | 7/2000 | Cote | 430/11 |
| 6,177,228 B1 | 1/2001 | Allen et al. | |
| 6,376,149 B1 | 4/2002 | Grober et al. | |
| 6,723,486 B2 | 4/2004 | Goodall et al. | |
| 6,806,027 B2 | 10/2004 | Hohle et al. | |
| 6,861,209 B2 | 3/2005 | Li et al. | |
| 7,022,459 B2 * | 4/2006 | Kodama | 430/270.1 |
| 2004/0185373 A1 * | 9/2004 | Kodama | 430/270.1 |
| 2006/0275698 A1 * | 12/2006 | Nguyen et al. | 430/270.1 |

* cited by examiner

*Primary Examiner*—Amanda C. Walke
(74) *Attorney, Agent, or Firm*—Ingrassia Fisher & Lorenz, P.C.

(57) ABSTRACT

Methods are provided for enhancing resolution of a chemically amplified photoresist. A film comprising a photoacid generator and a polymer comprising functional groups bonded to protecting moieties is deposited on a substrate. The film is exposed to patterned radiation. The patterned radiation results in protonation of a portion of the functional groups and the formation of a latent image within the film. The bonds between the protonated functional groups and the protecting moieties are selectively excited with non-thermal energy having a wavelength spectrum that resonantly cleaves the bonds.

25 Claims, 1 Drawing Sheet

METHODS FOR ENHANCING RESOLUTION OF A CHEMICALLY AMPLIFIED PHOTORESIST

FIELD OF THE INVENTION

The present invention generally to photolithography, and more particularly relates to methods for enhancing resolution of chemically amplified photoresists.

BACKGROUND OF THE INVENTION

Devices such as integrated circuits are complex structures made of a variety of materials. They are fabricated from the sequential formation of alternating and interconnecting bands of conductive, semiconductive and nonconductive layers on an appropriate substrate (e.g., silicon wafer) that are selectively patterned to form circuits and interconnections to produce specific electrical functions.

Photolithography is a commonly practiced process of creating a patterned mask on the surface of a semiconductor wafer so that subsequent patterned processes may be performed. Typically these subsequent patterned processes involve the addition or subtraction of a material by deposition, implant doping, or plasma etching.

Frequently, the pattern is transferred from an exposure mask to the wafer using a photoresist layer and optical lithography exposure tools. A positive or negative image of the desired configuration is first introduced into the resist by exposing it to patterned radiation which induces a chemical change in the exposed portions of the resist. This chemical change is then exploited to develop a pattern in the resist, termed a "latent image." This pattern is then transferred into the substrate underlying the resist.

A variety of resist materials are employed in lithographic processes for device fabrication. One class of such resist materials includes chemically amplified photoresists. A chemically amplified photoresist is a photoresist to which an acid catalyst reaction is applied. The resist contains a polymer that has certain functional groups, for example, alcohol (OH), phenol ($C_2H_5OH$), carboxylic acid (COOH), and the like. A certain portion of these functional groups are "masked", i.e., the hydrogen atom is removed and replaced by moieties referred to as protecting groups. These protecting groups are removable from the polymer by acidolysis or hydrolysis.

The resist materials also contain an energy-sensitive material in combination with the polymer. When exposed to a certain energy (energy of a particular wavelength) or type (i.e., electron beam), a moiety is generated from the energy-sensitive material which effects the cleavage of the protecting group, thereby "unmasking" the functional group in a "deprotection" reaction. When the protecting group is an acid labile group, i.e., it is removed in the presence of acid, the energy sensitive material is typically a photoacid generator (PAG). The greater the number of protecting groups that are cleaved from the polymer, the greater the chemical contrast between the polymer exposed to radiation and the polymer not exposed to radiation. This chemical contrast between the unexposed resist material and the exposed resist material is exploited to develop a pattern in the resist material.

The chemical contrast is typically a difference between the solubility of the exposed resist compared to that of the unexposed resist in a developer solution, which is typically an aqueous alkali solution. In the case of positive resists, for example, those areas of the photoresist that were not exposed to activating radiation are generally not soluble in alkali, thereby providing a dissolution differential between exposed and unexposed regions during development. Following development, the surface of the semiconductor substrate can be selectively etched by using the photoresist pattern described above as a mask.

During exposure of the resist to energy, as described above, there is a tendency for the acid that effects deprotection to diffuse from the exposed resist into the unexposed resist. Such diffusion, if significant enough, will erode the resolution of the patterned features. The result is features that do not have the desired dimensions being transferred to the wafer. When the diffusion is extreme, the latent image in the resist can be destroyed.

Accordingly, it is desirable to provide a method for enhancing resolution of a chemically amplified photoresist. In addition, it is desirable to provide a method for generating on a substrate a resist image having well-defined dimensions. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

In an exemplary embodiment of the invention, a method for enhancing resolution of a chemically amplified photoresist is provided. The method comprises depositing on a substrate a film comprising a photoacid generator and a polymer comprising functional groups bonded to protecting moieties. The film is exposed to patterned radiation. The patterned radiation results in protonation of a portion of the functional groups and the formation of a latent image within the film. The bonds between the protonated functional groups and the protecting moieties then are selectively excited with non-thermal energy having a wavelength spectrum that resonantly cleaves the bonds.

In another exemplary embodiment of the invention, a method for generating a resist image on a substrate is provided. The method comprises coating a substrate with a chemically amplified photoresist comprising a photoacid generator and a polymer having functional groups bonded to acid labile groups. Acid from the photoacid generator is generated and protonation of a portion of the functional groups of the polymer is effected. The chemically amplified photoresist is exposed to electromagnetic radiation having a wavelength spectrum that is narrower than that of black body radiation and that corresponds to the absorption spectrum of the bonds between the protonated functional groups and the acid labile groups.

In a further exemplary embodiment of the invention, a method for device fabrication is provided. The method comprises forming a layer of chemically amplified photoresist on a substrate. The chemically amplified photoresist comprises a photoacid generator and a polymer having bonds between functional groups and protection groups. The layer of chemically amplified photoresist is exposed to patterned radiation selected from the group consisting of ultraviolet radiation, EUV radiation, x-ray radiation, electron beam radiation, and ion beam radiation to introduce an image into the photoresist and protonation of the functional groups is effected. The layer of chemically amplified photoresist is subjected to electromagnetic radiation that has a wavelength spectrum that corresponds to the absorption spectrum of the bonds such that the protection groups are disassociated from the protonated functional groups. The image is developed into a pattern and the pattern is transferred into the substrate.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
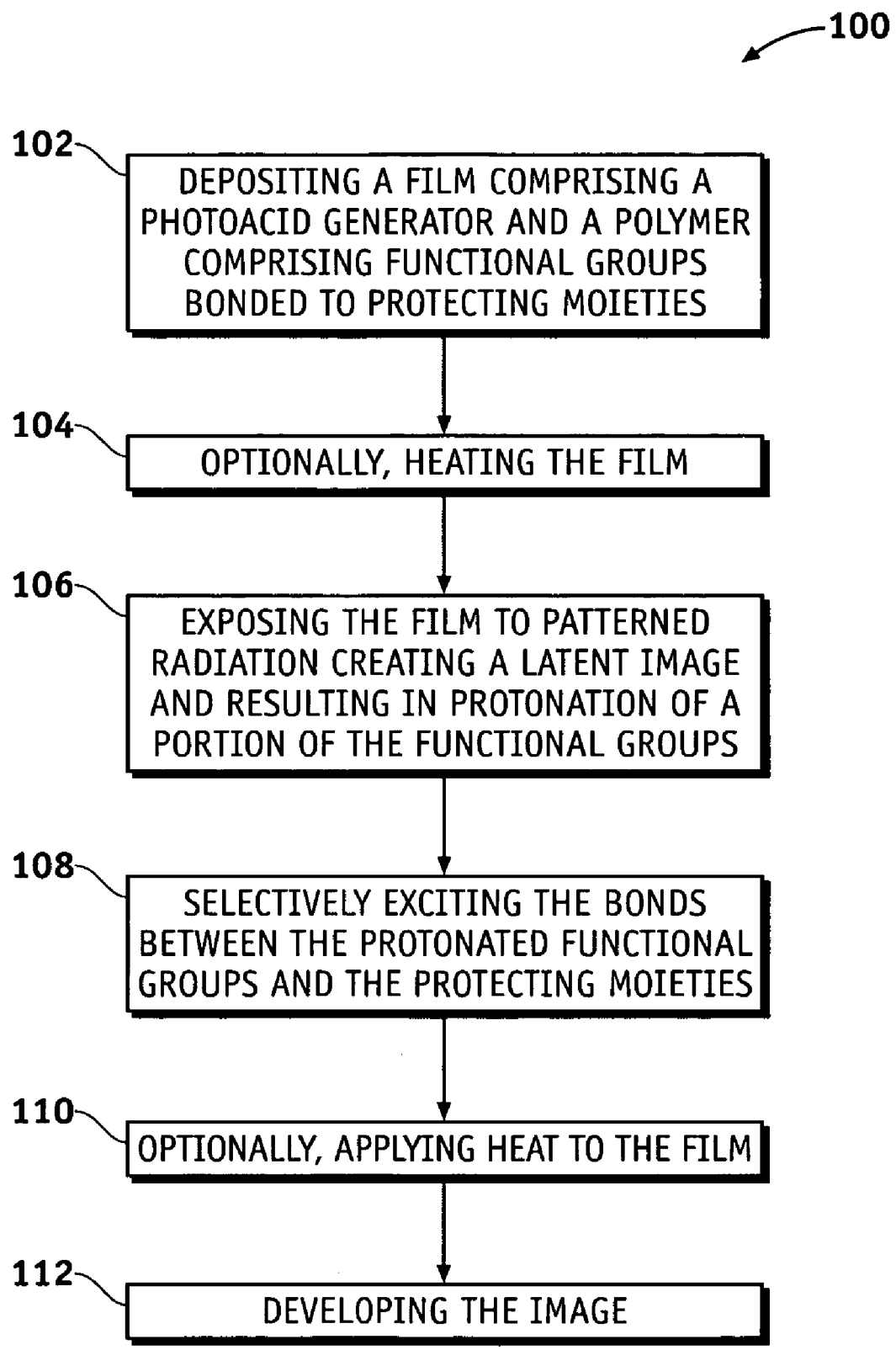
FIG. 1 is a flowchart of a method for enhancing resolution of a chemically amplified photoresist in accordance with an exemplary embodiment of the present invention.

The following detailed description of the invention is merely exemplary in nature and is not intended to limit the invention or the application and uses of the invention. Furthermore, there is no intention to be bound by any theory presented in the preceding background of the invention or the following detailed description of the invention.

Referring to FIG. 1, a method 100 for enhancing the resolution of a chemically amplified photoresist in accordance with an exemplary embodiment of the present invention begins by depositing on a substrate a film comprising a chemically amplified photoresist formed of a photoacid generator or "PAG" and a polymer comprising functional groups bonded to protecting moieties (step 102). The film further comprises a solvent within which the chemically amplified photoresist is incorporated. The term "photoresist" is used interchangeably herein with the term "resist." Photoresists of the present invention may be negative (or negative-tone) photoresists, or positive (or positive-tone) photoresists, as these terms are known in the art. Upon exposure of the chemically amplified photoresist to radiation, one photon or energetic particle is absorbed by the PAG, which generates an acid molecule that subsequently may cause or catalyze numerous chemical events, or may cause or catalyze individual cleavage reactions of protecting moieties in the chemically amplified photoresist. The acidic molecules may be considered catalysts because the acid may be regenerated after each of many individual reactions.

Suitable substrates upon which the film is deposited include silicon wafers, either in their original state or upon which various metal, dielectric or other material layers have been deposited. The substrate may be functionalized glass, silicon, germanium, gallium arsenide, gallium phosphorous, silicon dioxide, silicon nitride, modified silicon or any one of a wide variety of gels or polymers, such as (poly)tetrafluoroethylene, (poly)vinylidenedifluoride, polystyrene, polycarbonate, polypropylene, or combinations thereof. Preferably the surface of the substrate is cleaned by standard procedures, such as vapor priming, before the film is disposed thereon. The film can be coated on the substrate using known techniques, such as spin or spray coating, dipping, or the like.

Solvents that can be used for the resist include methoxypropyl acetate, cyclopentanone, cyclohexanone, γ-butyrolactone, ethyl lactate, diethylene glycol, diethyl ether, ethylene glycol dimethyl ether, dimethyl ether, or a mixture of at least two of these solvents. In general, however, the resist components can be dissolved in any common solvent or mixture thereof that can form a clear, homogeneous, and storage-stable solution and that can ensure good coat quality when the substrate is coated.

Suitable chemically amplified photoresists include those chemically amplified photoresists used in DUV, 193 nm, and 157 nm applications or the like. This includes, but is not limited to, novolaks, polyvinylphenols, acetals, acrylates, cyclic olefins, and the like. Other chemically amplified photoresist formulations will be apparent to those skilled in the art. Chemically amplified photoresists are commercially available from a number of sources including Rohm and Haas Electronic Materials of Marlborough, Mass., and Tokyo Ohka Kogyo of Tokyo, Japan.

The base polymer of the chemically amplified photoresist generally comprises functional groups, such as alcohol (OH), phenol ($C_2H_5OH$), carboxylic acid (COOH) and the like, which are bonded to or "masked" by protective groups, that is, the hydrogen atom is removed from the functional group and replaced with the protective group. The protective groups can undergo acidolysis that results in a significant change in the solubility of the polymer in developer solution. The polymer typically is a polymer or copolymer of vinyl phenol and optionally other copolymerizable groups. The polymers useful in the method of the present invention are not limited to polymers that are formed by vinylic addition polymerization, however. Other polymerizations such as condensation, polyaddition, and addition condensation are useful mechanisms for producing suitable polymers. Copolymers comprise units of substituted or unsubstituted phenols and non-aromatic groups, particularly copolymers of vinyl phenols and alkyl acrylates, typically alkyl acrylates having from 1 to about 12 carbon atoms. For example, the polymer may include at least one of poly(p-tertbutoxycarbonyloxy-α-methylstyrene), poly (p-tert-butoxycarbonyloxystyrene), poly(tert-butyl p-vinylbenzoate), poly(tert-butyl p-isopropenylphenyloxyacetate), poly(tert-butyl methacrylate), polymethylmethacrylate, acrylate-based polymers, a novolak/diazonaphthoquinione resin, a nitrene-crossed hydroxystyrene polymer, and poly(butene-1-sulfone). For convenience, "tert" is shortened to "t" hereinafter. In another example, the polymer comprises phenolic and cyclic alcohol units, hydroxystyrene and acrylate, methacrylate, mixtures of acrylate and methacrylate, adamantyl methacrylate, 3-oxo-cyclohexyl methacrylate, tetrahydropyranymethacrylate, trycyclodecanyl acrylate, isobornyl polymers, polynorbornene, polyanthrylmethacrylate, poly(vinylmethyl ether-co-maleic anhydride), or poly(styrene-co-maleic anhydride). The polymeric material may include a partially t-butoxycarbonyloxy-substituted poly-p-hydroxystyrene, partially t-butoxycarbonyloxy-substituted poly-3-hydroxyphenyl phenylsiloxane, partially t-butyl-substituted polymethacrylate, and partially adamantly-substituted polymethacrylate.

Examples of suitable protecting moieties include acid labile groups such as acetal groups, ketal groups, beta-silicon-substituted alkyls such as bis(trimethylsilylmethyl)methyl and 1-(trimethylsilylmethyl)methyl, tert-butyl esters, tert-butyl esters of carboxylic acids, and tert-butyl ethers. It is understood that a wide range of acid labile groups are operative in the invention.

Examples of suitable polymers with these acid labile groups include acrylate-based polymers and copolymers, methacrylate-based polymers and copolymers, copolymers with alicyclic moieties (e.g. norbornene) either incorporated into the polymer backbone or pendant to the polymer backbone. Examples of these polymers include tetra polymers such as poly(cycloolefin-alt-maleic anhydride-co-t-butyl acrylate-co-acrylic acid) wherein the cycloolefin is, for example, norbornene, 5,6-dihydrodicyclopentadiene, 1,5-cyclooctadiene, and 1,5-dimethyl-1,5-cyclooctadiene.

Photoacid generators useful in the practice of the present invention include, without limitation, metallic, metalloid, and non-metallic onium salts, aryl sulfonates including, without limitation, tris-pyrogallol sulfonates and anthracene-2-sulfonates such as 9,10-diethylanthracene-2-sulfonate, 2-nitrobenzyl esters, beta-ketosulfones, disulfones, arylsulfonyl-alpha-keto- and alpha carboxyl-diazomethanes, and precursors of substituted and unsubstituted sulfonic acids.

Additional examples of photoacid generators useful in the practice of the present invention include N-(trifluoromethylsulfonyloxy)-bicyclo-[2.2.1]hept-5-ene-2,3-dicarboximide (MDT), N-(trifluoromethylsulfonyloxy) nitronaphthalimides, N-(trifluoromethylsulfonyloxy)-4-halonaphthalimides, N,N'-bis(camphorsulfonyloxy)-3,4,9,10-perylenetetracarbox-diimide, N-(trifluoromethylsulfonyloxy)-7-oxabicyclo-[2.2.1]hept-5-ene-2,3-dicarboximide, N-(trifluoromethylsulfonyloxy) -succinimide, N,N'-bis(trifluoromethylsulfonyloxy)-(3-methyl-4,5-imidocyclohex-3-enyl) -succinimide, N-(trifluoromethylsulfonyloxy)-diphenylmaleimide, di-[N-(trifluoromethylsulfonyloxy)-phthalimidyl]ether, bistrifluoromethyl-bis-N,N-(trifluoromethylsuflonyloxy)-phthalimidylmethane, N-(camphorsulfonyloxy)-naphthalimide, N-(camphorsulfonyloxy)-nitronaphthalimides, and the corresponding tosyl-, brosyl-, fluoro-, and perfluoro-benzenesulfonyloxy-, nitrobenzenesulfonyloxy-, and halobenzenesulfonyloxy-analogs thereof. It will be understood that other photoacid generators known in the art may also be useful in the practice of the present invention.

The photoacid generator will be selected to respond to the light energy used for pattern-wise exposing the chemically amplified photoresist. Photoacid generators are currently available for a variety of different wavelengths from visible to X-ray; accordingly, the artisan will select the appropriate photoacid generator based on their knowledge of the kind of radiation to which the photoresist will be exposed during patterned radiation. The photoacid generator will preferably comprise about 0.01 to about 20% by weight of the photoresist composition, more preferably about 1 to about 10% by weight.

In an optional exemplary embodiment of the invention, after the chemically amplified photoresist is deposited onto the substrate, the film may be heated or "soft-baked" to improve adhesion of the photoresist to the substrate and to evaporate the solvent in which the photoresist is dispersed (step 104). In an exemplary embodiment of the invention, the film is heated to a temperature in the range of about 70 to 150° C. In another exemplary embodiment of the invention, the film is heated for a period of about 30 to 60 seconds. After heating, the film then is allowed to cool.

As mentioned above, the film is exposed to patterned radiation (step 106). The radiation may comprise any radiation commonly used to create a latent image in chemically amplified photoresist, such as patterned x-ray radiation, patterned e-beam radiation, patterned ion beam radiation, patterned extreme ultraviolet (EUV) radiation, patterned ultraviolet radiation, or the like. Preferably, the film is exposed to ultraviolet radiation with a wavelength in the range of about 13 nm to about 370 nm and more preferably, to ultraviolet radiation at a wavelength of about 193 nm or 13.5 nm. The radiation is absorbed by the radiation-sensitive acid generator to generate free acid. The free acid results in protonation of the functional group of the chemically amplified photoresist. In addition, the radiation creates in the photoresist a latent image of the pattern of the radiation, which image is to be transferred to the substrate.

After the film is exposed to patterned radiation, the bonds between the protonated functional groups and the protecting moieties, e.g., the acid labile groups, are selectively excited (step 108). The bonds are selectively excited by exposing the film to a non-thermal source of energy that has a relatively narrow wavelength spectrum that is less than that of black body radiation and that corresponds to the absorption spectrum of the bonds. In this manner, the non-thermal energy resonantly cleaves the bonds, thus resulting in disassociation of the protecting moieties from the protonated functional groups. As noted above, the portion of the photoresist having fewer bonded protecting moieties has a much different solubility when exposed to a developer than the portion of the photoresist having more bonded protecting moieties. By using a non-thermal source of energy with a narrow wavelength spectrum, the deprotection reaction is facilitated while generation of heat is reduced or minimized. By reducing or minimizing heat generation, diffusion of the acid from radiated areas of the film to non-radiated areas of the film, which otherwise would be enhanced by heat generation, is minimized. This reduction in acid diffusion results in enhanced resolution of the photoresist.

Suitable types of non-thermal energy that may be used to excite the bonds between the protonated functional groups and the protecting moieties include infrared radiation, preferably infrared radiation having a wavelength greater than about 10,000 nm, radiation having a wavenumber of 1750 cm$^{-1}$, radiation having a wavenumber of 1180 cm$^{-1}$, microwave radiation, and the like. Sources of non-thermal energy that can provide a narrow wavelength spectrum suitable for use in the present invention include lasers and sources of THz radiation. The photoresist is exposed to the non-thermal energy source for a time sufficient to permit the free acid and the non-thermal energy to cleave the bonds. In a preferred embodiment, the photoresist is exposed to the non-thermal energy source for a time sufficient to permit the free acid and the non-thermal energy to cleave the bonds and to regenerate the acid. More preferably, the photoresist is exposed to the non-thermal energy source for about 2 seconds up to about 5 minutes. In one exemplary embodiment of the invention, the photoresist film is exposed to the non-thermal energy source continuously during this time range. In another exemplary embodiment of the invention, the photoresist film is exposed to pulses of the non-thermal energy during this time range. In this manner, the total heat absorbed by the resist film during the exposure to the non-thermal energy source can be further reduced because the bonds between the protonated functional groups and the protecting moieties can be cleaved during the heat pulses and the acids can reprotonate another protecting moiety between the heat pulses (in the "off" time of the cycle), thus producing the desired chemical amplification with minimal diffusion.

In an optional embodiment of the invention, before, during or after the photoresist is exposed to the non-thermal energy source, a small amount of heat is applied to the photoresist (step 110). The amount of heat applied to the photoresist is less than that which would be applied to the photoresist during a post-patterned radiation bake to facilitate the deprotection reaction by the acid. In this manner, diffusion of the acid can be better controlled so that a sufficient amount of acid is permitted to diffuse through the area of the photoresist that was exposed to the patterned radiation to enhance the deprotection reaction, while diffusion of the acid to and through the areas of the photoresist that were not so exposed is reduced or minimized. Alternatively, while the photoresist is exposed to the non-thermal energy source, it can be cooled, thereby further reducing or minimizing the diffusion of the acid to and through the areas of the photoresist that were not exposed to the patterned radiation.

After the non-thermal energy exposure, the latent image in the photoresist then is developed using a suitable solvent (step 112). Suitable solvents for developing the image include an aqueous base, preferably an aqueous base without metal ions, such as the industry standard developer tetramethyl ammonium hydroxide or choline, or water and base with lower alkyl alcohols such as isopropanol, ethanol, methanol, and mixtures thereof. Generally, immersion in the developer for a time period from about 10 seconds to about 5 minutes produces the desired delineation. After the development, the wafer is dried and cooled and the pattern in the resist then is transferred into the underlying substrate using conventional etching expedients well known to one skilled in the art.

Accordingly, a method for enhancing the resolution of a chemically amplified photoresist has been described. The method permits facilitation of the deprotection reaction, while reducing or controlling acid diffusion that otherwise could compromise the integrity of the image to be transferred by the photoresist. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for enhancing resolution of a chemically amplified photoresist, the method comprising the steps of:
    depositing on a substrate a film comprising a photoacid generator and a polymer comprising functional groups bonded to protecting moieties;
    exposing the film to patterned radiation, wherein the patterned radiation results in protonation of a portion of the functional groups and the formation of a latent image within the film; and
    selectively exciting the bonds between the protonated functional groups and the protecting moieties with non-thermal energy having a wavelength spectrum that resonantly cleaves the bonds, wherein the step of selectively exciting is performed after the step of exposing the film to patterned radiation.

2. The method of claim 1, wherein the step of selectively exciting the bonds between the protonated functional groups and the protecting moieties with non-thermal energy having a wavelength spectrum that resonantly cleaves the bonds comprises the step of exciting the bonds with non-thermal energy having a wavelength spectrum narrower than that of black body radiation.

3. The method of claim 2, wherein the step of selectively exciting the bonds between the protonated functional groups and the protecting moieties with non-thermal energy having a wavelength spectrum that resonantly cleaves the bonds comprises the step of exciting the bonds with non-thermal energy having a wavelength spectrum that corresponds to the absorption spectrum of the bonds.

4. The method of claim 1, wherein the step of selectively exciting the bonds between the protonated functional groups and the protecting moieties with non-thermal energy comprises the step of selectively exciting the bonds with infrared radiation, radiation having a wavenumber of 1750 $cm^{-1}$, radiation having a wavenumber of 1180 $cm^{-1}$, or microwave radiation.

5. The method of claim 1, further comprising the step of applying heat to the film after the step of exposing the film to patterned radiation.

6. The method of claim 1, further comprising the step of cooling the film after the step of exposing the film to patterned radiation.

7. The method of claim 1, further comprising the step of heating the film before the step of exposing the film to patterned radiation.

8. The method of claim 1, wherein the step of selectively exciting the bonds between the protonated functional groups and the protecting moieties with non-thermal energy comprises the step of continuously exposing the film to the non-thermal energy.

9. The method of claim 1, wherein the step of selectively exciting the bonds between the protonated functional groups and the protecting moieties with non-thermal energy comprises the step of exposing the film to pulses of the non-thermal energy.

10. The method of claim 1, wherein the step of selectively exciting the bonds between the protonated functional groups and the protecting moieties with non-thermal energy comprises the step of exposing the film to the non-thermal energy for a period of about 2 seconds to about 5 minutes.

11. The method of claim 1, wherein the step of depositing on a substrate a film comprising a photoacid generator and a polymer comprising functional groups bonded to protecting moieties comprises the step of depositing on a substrate a film comprising a photoacid generator and a polymer comprising functional groups bonded to acid labile groups.

12. A method for generating a resist image on a substrate, the method comprising the steps of:
    coating a substrate with a chemically amplified photoresist comprising a photoacid generator and a polymer having functional groups bonded to acid labile groups;
    generating acid from the photoacid generator and effecting protonation of a portion of the functional groups of the polymer by the acid; and
    exposing the chemically amplified photoresist to electromagnetic radiation having a wavelength spectrum that is narrower than that of black body radiation and that corresponds to the absorption spectrum of the bonds between the protonated functional groups and the acid labile groups, wherein the step of exposing is performed after the steps of generating acid and effecting protonation.

13. The method of claim 12, further comprising the step of contacting the chemically amplified photoresist with a developer after the step of exposing the chemically amplified photoresist to electromagnetic radiation.

14. The method of claim 12, wherein the step of generating acid from the photoacid generator and effecting protonation of a portion of the functional groups of the polymer comprises the step of exposing the chemically amplified photoresist to patterned radiation.

15. The method of claim 14, wherein the step of exposing the chemically amplified photoresist to patterned radiation comprises the step of exposing the film to patterned x-ray radiation, patterned e-beam radiation, patterned ion beam radiation, patterned EUV radiation, or patterned ultraviolet radiation.

16. The method of claim 12, wherein the step of exposing the chemically amplified photoresist to electromagnetic radiation comprises the step of exposing the chemically amplified photoresist to infrared radiation, radiation having a wavenumber of 1750 $cm^{-1}$, radiation having a wavenumber of 1180 $cm^{-1}$, or microwave radiation.

17. The method of claim 12, further comprising the step of applying heat to the film after the step of generating acid from the photoacid generator and effecting protonation of a portion of the functional groups of the polymer.

18. The method of claim 12, further comprising the step of cooling the film after the step of generating acid from the photoacid generator and effecting protonation of a portion of the functional groups of the polymer.

19. The method of claim 12, wherein the step of exposing the chemically amplified photoresist to electromagnetic radiation comprises the step of exposing the film to pulses of electromagnetic radiation.

20. A method for device fabrication comprising the steps of:
   forming a layer of chemically amplified photoresist on a substrate, wherein the chemically amplified photoresist comprises a photoacid generator and a polymer having bonds between functional groups and protecting groups;
   exposing the layer of chemically amplified photoresist to patterned radiation selected from the group consisting of ultraviolet radiation, EUV radiation, x-ray radiation, electron beam radiation, and ion beam radiation to introduce an image into the photoresist;
   effecting protonation of the functional groups;
   subjecting the layer of chemically amplified photoresist to electromagnetic radiation that has a wavelength spectrum that corresponds to the absorption spectrum of the bonds such that the protecting groups are disassociated from the protonated functional groups, wherein the step of subjecting is performed after the steps of exposing and effecting;
   developing the image into a pattern; and
   transferring the pattern into the substrate.

21. The method of claim 20, wherein the step of effecting protonation of the functional groups results from the step of exposing the layer of chemically amplified photoresist to patterned radiation.

22. The method of claim 20, wherein the step of subjecting the layer of chemically amplified photoresist to electromagnetic radiation comprises the step of subjecting the chemically amplified photoresist to infrared radiation, radiation having a wavenumber of $1750\,cm^{-1}$, radiation having a wavenumber of $1180\,cm^{-1}$, or microwave radiation.

23. The method of claim 20, further comprising the step of applying heat to the chemically amplified photoresist after the step of effecting protonation of the functional groups.

24. The method of claim 20, further comprising the step of cooling the film after the step of effecting protonation of the functional groups.

25. The method of claim 20, wherein the step of subjecting the layer of chemically amplified photoresist to electromagnetic radiation comprises the step of subjecting the layer of chemically amplified photoresist to pulses of electromagnetic radiation.

* * * * *